United States Patent
Kobayashi

(10) Patent No.: US 7,427,832 B2
(45) Date of Patent: Sep. 23, 2008

(54) ORGANIC ELECTROLUMINESCENCE DEVICE AND MANUFACTURING METHOD THEREFOR

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 11/032,198

(22) Filed: Jan. 11, 2005

(65) Prior Publication Data

US 2005/0134171 A1  Jun. 23, 2005

Related U.S. Application Data

(62) Division of application No. 09/790,546, filed on Feb. 23, 2001, now Pat. No. 6,869,635.

(30) Foreign Application Priority Data

Feb. 25, 2000  (JP)  ............... 2000-050165

(51) Int. Cl.
    *H05B 33/00*  (2006.01)
(52) U.S. Cl. ............. 313/504; 313/512; 313/498
(58) Field of Classification Search ......... 313/504–512, 313/498
    See application file for complete search history.

(56) References Cited

U.S. PATENT DOCUMENTS

| | | | |
|---|---|---|---|
| 5,276,380 A | 1/1994 | Tang | |
| 5,281,489 A | 1/1994 | Mori et al. | |
| 5,427,858 A | 6/1995 | Nakamura et al. | |
| 5,742,129 A | 4/1998 | Nagayama et al. | |
| 5,834,893 A | 11/1998 | Bulovic et al. | |
| 5,972,419 A | 10/1999 | Roitman | |
| 6,091,194 A * | 7/2000 | Swirbel et al. | ............... 313/498 |
| 6,169,163 B1 | 1/2001 | Woo et al. | |
| 6,361,886 B2 | 3/2002 | Shi et al. | |
| 6,373,453 B1 | 4/2002 | Yudasaka | |
| 6,538,374 B2 | 3/2003 | Hosokawa | |
| 2003/0054186 A1 | 3/2003 | Miyashita et al. | |

FOREIGN PATENT DOCUMENTS

| | | |
|---|---|---|
| CN | 086115657 | 1/1998 |
| CN | 87103154 | 3/1998 |
| EP | 0 717 439 A2 | 6/1996 |
| EP | 0-822-603 A2 | 7/1997 |
| GB | 2 332 985 A | 7/1999 |
| JP | 8-54836 | 2/1996 |
| JP | 8-124679 | 5/1996 |
| JP | 8-213169 | 8/1996 |
| JP | A-9-330791 | 12/1997 |

(Continued)

OTHER PUBLICATIONS

JPO machine translation of JP 11-8074.

(Continued)

*Primary Examiner*—Joseph L Williams
(74) *Attorney, Agent, or Firm*—Oliff & Berridge, PLC

(57) ABSTRACT

An organic EL device in accordance with the invention has a structure in which a first electrode, a light-emitting layer, and a second electrode are formed on a substrate in this order, and light from the light-emitting layer is emitted to an exterior of the device via the second electrode.

11 Claims, 5 Drawing Sheets

FOREIGN PATENT DOCUMENTS

| | | |
|---|---|---|
| JP | A-10-074583 | 3/1998 |
| JP | A-10-294176 | 11/1998 |
| JP | 10-335068 | 12/1998 |
| JP | 11-8074 | 1/1999 |
| JP | A 11-008073 | 1/1999 |
| JP | 11-45780 | 2/1999 |
| JP | 11-74082 | 3/1999 |
| JP | 11-87062 | 3/1999 |
| JP | A 11-065487 | 3/1999 |
| JP | 11-224783 | 8/1999 |
| JP | A-11-224783 | 8/1999 |
| JP | A-11-307270 | 11/1999 |

OTHER PUBLICATIONS

Burrows, P.E. et al., "Achieving Full-Color Organic Light-Emitting Devices for Lightweight, Flat-Panel Displays", IEEE Transactions on Electron Devices, vol. 44, No. 8, Aug. 1997, pp. 1188-1203.

\* cited by examiner

- 12. ORGANIC EL DISPLAY PORTION
- 13. Y DRIVER
- 14. X DRIVER
- 15. CONTROLLER
- 16. ELECTRONIC CIRCUIT
- 17. POWER SUPPLY CIRCUIT
- 18. SILICON SUBSTRATE

POWER SUPPLY   SWITCH

- 19. LIGHT-ABSORBING LAYER
- 8. SEALING MATERIAL
- 9. PROTECTIVE SUBSTRATE
- 5. ANODE
- 7. AUXILIARY ANODE
- 4. HOLE INJECTION LAYER
- 3. LIGHT-EMITTING LAYER
- 6. PIXEL PARTITION
- 2. CATHODE
- 1. SUBSTRATE

ORGANIC ELECTROLUMINESCENCE DEVICE AND MANUFACTURING METHOD THEREFOR

This is a Division of application Ser. No. 09/790,546 filed Feb. 23, 2001. The entire disclosure of the prior application is hereby incorporated by reference herein in its entirety.

The present invention relates to the structure of an electroluminescent (in this specification, referred to as organic EL) device for use as a display device in an information terminal apparatus, such as a computer, a mobile phone, or a television, and also relates to a manufacturing method thereof.

Recently, there has been an increasing trend toward portability of information terminals, and development of power saving displays, which are necessary to enhance portability. Among displays, organic EL displays in particular have drawn attention, and the development thereof is at the stage of pursuing practical applications.

In order to realize power saving displays, it is believed that it is most effective to drive an organic EL element by an active element, such as a thin-film transistor (TFT). The reason for this is that, when an active element is used, an organic EL element can be driven by a DC voltage, and can be driven at a low voltage without imposing a load thereon in the range of high luminous efficiency. In the case of simple matrix driving, which uses no active devices, the luminance must be increased by applying a high voltage during a selection period. Accordingly, a significant load is imposed on the organic EL element, and in addition, the luminance efficiency is decreased. As a result, the life thereof is naturally shortened.

An active matrix method using a TFT or the like is a strong candidate for use in a power saving organic EL display; however, it has the shortcoming that the aperture ratio, which indicates the ratio of the light-emitting area to the display area for display, is decreased. When the aperture ratio is decreased, luminance in each pixel must be enhanced in order to increase the display luminance. In the case described above, a driving voltage is increased, power consumption is thereby increased, and hence, a problem may arise in that the life is shortened due to the load imposed on the organic EL element. In order to solve the problem described above, as shown in FIG. 2, in the structure of an organic EL element (device), a transparent cathode can be formed in order to emit light from a side opposite to the substrate (IEEE, TRANSACTIONS ON ELECTRON DEVICES, VOL. 44, NO. 8, PP 1188-1203). In particular, an anode 5, a hole injection layer 4, a light-emitting layer 3, a cathode 2, and a transparent auxiliary cathode 21 are sequentially formed on a substrate 1 in this order, and light is emitted from the transparent auxiliary cathode 21 side. In the structure described above, the light may not be emitted from the TFT substrate side; however, the light transmittance of the cathode used in the structure described above is approximately one-half of that of the substrate, and as a result, a problem may arise in that the brightness of the display is actually reduced.

The invention solves the problems described above, and an object of the present invention is to provide an arrangement of elements in which the aperture ratio and the light transmittance are not degraded even when a switching element is used. It is also an object of the invention to provide a manufacturing method thereof. In other words, an organic EL device is provided which consumes low electric power and has a long life. In addition, a structure is also proposed in which a decrease in contrast is prevented, which is caused by incident outside light, without decreasing the luminance.

According to the present invention, an organic EL device is provided including at least a cathode, a light-emitting layer, and an anode formed on a substrate in this order.

In addition, according to the present invention, an organic EL device includes a plurality of pixels provided on a substrate, in which each of the plurality of pixels is in an area defined by a partition, a first electrode, a light-emitting layer, and a second electrode are formed in the area in this order, and light from the light-emitting layer is emitted outside from the second electrode side.

In addition, according to the present invention, a method for manufacturing an organic EL device is provided in which at least a cathode, a light-emitting layer, and a transparent anode are formed on a substrate in this order.

DETAILED DESCRIPTION OF THE PREFERRED EMBODIMENTS

Figure 1:
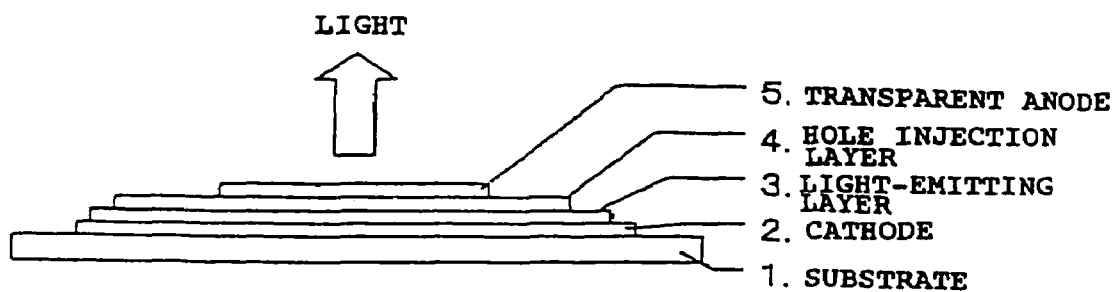
FIG. 1 is a cross-sectional view showing the structure of an organic EL device according to Embodiment 1.
Figure 2:
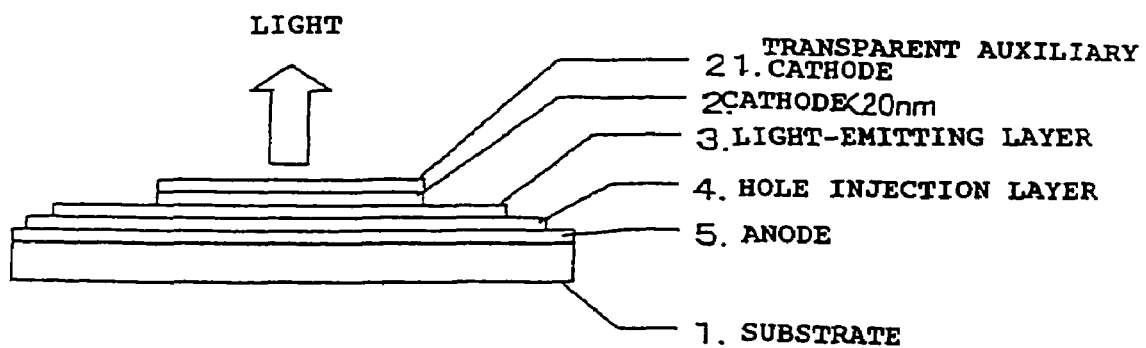
FIG. 2 is a cross-sectional view showing the structure of a related art organic EL device for comparison to Embodiment 1 of FIG. 1.

A first characteristic of the present invention is that in an organic EL device, at least a cathode, a light-emitting layer, and an anode are formed on a substrate in this order.

According to the arrangement described above, since light can be emitted to a side opposite to the substrate when observed from the light-emitting layer, an opaque material can be used at the substrate side. For example, a semiconductor substrate, such as silicon, or a metal substrate, may be used. Accordingly, an integrated circuit is formed on a silicon substrate, and an organic EL element (device) can be formed thereon. In addition, a hole transport layer and/or a hole injection layer are preferably formed between the light-emitting layer and a transparent anode.

As an example of the embodiment, for example, the following modes may be mentioned.

(1) In the organic EL device having the first characteristic arrangement described above, the cathode includes a laminate of at least one type of conductive material and a metal oxide or fluoride.

According to this arrangement, in the organic EL device, the luminous efficiency can be further enhanced.

(2) In the organic EL device having the first characteristic arrangement described above, a plurality of pixels is provided, cathodes corresponding to the plurality of pixels are formed on the substrate, pixel partitions formed of an insulating material are formed between the pixels, and auxiliary anodes including a conductive material are formed having patterns equivalent to those of the partitions at locations corresponding to the top surfaces of the partitions formed of the insulating material.

According to this arrangement, the resistance of the transparent anode having a relatively high resistance can be decreased by using the auxiliary anode, and as a result, an organic EL device uniformly emitting light from the entire surface thereof can be realized.

(3) In the organic EL device having the first characteristic arrangement described above, a plurality of pixels is provided, cathodes corresponding to individual pixels are formed on the substrate, pixel partitions formed of an insulating material are formed between the pixels, and at least the cathode, the light-emitting layer, the anode, and an auxiliary anode are formed in each pixel in this order.

According to this arrangement, the auxiliary anode can be formed in a subsequent step, various materials can be used for the auxiliary anode as the effect, and advantages can be obtained relating to particular features of the material. A mask deposition method, an inkjet method, a printing method, or the like may be used for patterning the auxiliary anode.

(4) In the organic EL device as described in headings (2) or (3), the auxiliary anode includes a light-absorbing conductive material.

According to this arrangement, when the display is observed from a side to which light is emitted, since the light-absorbing auxiliary anodes are seen between the pixels, outside light is absorbed, and the contrast can be enhanced, whereby the display becomes easy to see.

(5) In the organic EL device as described in heading (4), the auxiliary anode includes carbon or chromium.

According to this arrangement, outside light is more effectively absorbed between the pixels.

(6) In the organic EL device having the first characteristic arrangement described above, an active matrix structure containing switching elements is provided on the substrate, and a laminate structure of at least the cathode, the light-emitting layer, and the anode are formed so as to overlap at least a part of the switching element when viewed from the top side.

According to this arrangement, an area of an aperture portion in the pixel can be designed independently from a circuit relating to the switching element, which significantly increases the aperture ratio.

(7) In the organic EL device having the first characteristic described above, a semiconductor substrate having an integrated circuit thereon is used as the substrate.

According to this arrangement, all electronic circuits required for the device, such as electronic circuits for a portable terminal, controllers, drivers, and power circuits used for display driving, can be formed on the semiconductor substrate formed of the silicon substrate, and in addition, transistors and the like that drive the organic EL device can also be provided thereon, whereby higher performance of the device and cost reduction thereof can be simultaneously realized.

(8) In the organic EL device as described in headings (3) or (4), after the anodes and/or the auxiliary anodes are formed, a protective substrate having a light-absorbing layer formed at positions corresponding to areas between the pixels is disposed so that the pixels and areas of the protective substrate corresponding thereto are aligned with each other, and the protective substrate is then bonded to the pixels with a sealing resin provided therebetween.

According to this arrangement, since light-absorbing portions can be provided between the pixels in addition to the auxiliary anodes, the auxiliary anodes and the light-absorbing material can be optimized.

(9) A method for manufacturing an organic EL device includes forming at least a cathode, a light-emitting layer, and an anode on a substrate in this order.

According to this method, it is preferable that a hole transport layer and/or a hole injection layer be formed on the light-emitting layer, and the anodes can be subsequently formed.

(10) The method for manufacturing an organic EL device as described in heading (9) further includes performing a treatment for imparting hydrophilic properties to the surface of the light-emitting layer.

According to this method, a water-soluble solution containing a hole injection material can be uniformly coated. As a common method therefor, an oxygen plasma irradiation method is used.

(11) A method for manufacturing an organic EL device includes the steps of forming at least insulating pixel partitions on a substrate, subsequently depositing a light-reflecting cathode material on the entire surface and simultaneously forming cathodes and auxiliary electrodes by separating the cathodes and the auxiliary anodes on the partitions using steps thereof, and subsequently forming at least a light-emitting layer, and anodes in the areas defined by the partitions in this order.

According to this method, patterning for the auxiliary anodes is not necessary, and the cost can be reduced.

(12) A method for manufacturing an organic EL device includes the steps of, after the cathodes are formed on the substrate, coating the entire surface of the substrate with an insulating material for pixel partitions followed by calcining, forming a film formed of a material for auxiliary anodes over the entire surface, subsequently etching the film of the material for the auxiliary anodes for patterning in a photolithographic step, subsequently etching the pixel partition layer thereunder for patterning, firing the partition layer, and subsequently forming at least a light-emitting layer and an anode in this order in each area defined by the partition.

According to this method, patterning for the pixel partitions and the auxiliary anodes can be simultaneously performed.

Hereinafter, particular embodiments of the present invention will be described.

Embodiment 1

In this embodiment, an example will be described in which at least a cathode, a light-emitting layer, a transparent anode, and a hole transport layer and/or a hole injection layer are formed on a substrate in this order. In FIG. 1, a cross-sectional view of an organic EL device according to this embodiment is shown.

First, a cathode 2 was formed on a substrate 1. Next, a light-emitting layer 3 was formed, and in addition, a hole injection layer 4 was formed. Next, an anode 5 was formed, and in addition, a sealing layer (not shown in the figure) was formed.

When a voltage was applied between electrodes of the organic EL device thus formed, light was emitted from the sealing layer side.

For the substrate 1 used in this embodiment, in addition to a glass substrate, a metal, a semiconductor, a plastic, or the like may be used, and an opaque substrate may also be used.

For the cathode 2 used in this embodiment, aluminum, magnesium, lithium, or calcium may be used, and in addition, the alloy thereof or a laminate formed of these metals (in this case, a layer having a smaller work function is disposed at the light-emitting layer side) may also be used.

For the light-emitting layer 3 used in this embodiment, a polymeric material, or a low molecular weight material may be used. For example, PPV, polydioctylfluorene, polyfluorene, Alq3, DPVBi, and the like may be used.

For the hole injection layer/hole transport layer 4, in addition to Bytron manufactured by Bayer AG., a common material, such as low molecular material TPD, MTDATA, or copper phthalocyanine, may also be used.

For the anode 5 used in this embodiment, in addition to ITO, a Nesa film, IDIXO sold by Idemitsu Kosan Co., Ltd., or the like may also be used. In particular, IDIXO is preferably used since satisfactory conductive characteristics can be obtained even when the film thereof is formed at room temperature.

For sealing, a thermosetting epoxy resin was used; however, an ultraviolet curable resin may also be used. In addition, it is effective to use a protective substrate together therewith.

According to the arrangement of this example, since light can be emitted from a side opposite to the substrate when observed from the light-emitting layer, an opaque material can be used at the substrate side. For example, a semiconductor substrate, such as silicon, or a metal substrate may be used. As a result, an integrated circuit is formed on a silicon substrate, and an organic EL element (device) can be formed thereon.

Embodiment 2

In this embodiment, a particular example will be described in which the cathode is formed of a laminate formed of at least one type of conductive material and a metal oxide or fluoride. By using the method of Embodiment 1, when patterning was performed in a photolithographic step after an aluminum film was formed as a cathode, and an oxygen plasma treatment was then performed, an oxide layer 20 Å thick was formed on the surface. By using this substrate provided with the cathode, when an organic EL device was formed by performing the outstanding steps in Embodiment 1, the luminous efficiency thereof was two times (0.2 lm/W) that obtained in Embodiment 1.

Instead of the oxygen plasma treatment performed on the surface of the cathode, when lithium fluoride 20 Å thick was deposited, the luminous efficiency was 0.5 lm/W.

The light-emitting layer 3 used in this embodiment was formed of a polyfluorene material and was formed by spin coating. The hole injection layer 4 was formed by spin coating using Bytron manufactured by Bayer AG. The anode 5 was formed of IDIXO. Materials and conditions for film formation are not limited to those described above.

Embodiment 3

In this embodiment, an example of the structure shown in FIG. 3 will be described in which a plurality of cathodes 2 corresponding to a plurality of light-emitting pixels are formed on a substrate 1, pixel partitions 6 formed of an insulating material are formed between the light-emitting pixels, and auxiliary anodes 7 formed of a conductive material having approximately equivalent patterns to those of the pixel partitions 6 are formed thereon.

A particular example is described below. First, after the cathodes 2 were patterned, the pixel partitions 6 were formed of a polyimide and were patterned, and subsequently, a film formed of tantalum 1,000 Å thick was formed and was then patterned so as to form the same pattern as that of the pixel partition 6. Next, a film formed of lithium fluoride 20 Å thick was formed on the entire surface, three types of polyfluorene materials emitting red, green, and blue light were each dissolved in isodurene, and the films thereof as the light-emitting layers 3 were formed in red, green, and blue pixels, respectively, by patterning using an inkjet method. Next, films formed of Bytron manufactured by Bayer AG. were formed by patterning in the individual pixels using an inkjet method as the hole injection layer 4. Next, as the anodes 5, a film of IDIXO manufactured by Idemitsu Kosan Co., Ltd. was formed by sputtering. In addition, sealing was performed by using an epoxy sealing material 8 and a protective substrate 9. To the individual pixels of the organic EL device thus formed, when voltages for red, blue, and green were independently applied, a uniform color image could be observed in accordance with the applied voltages.

In addition, as a reference, when an element provided with no auxiliary anode 7 was formed, pixels in the vicinity of lead wires for the anodes only emit light.

For the cathode, the light-emitting material, the material for the hole injection material, the anode, the auxiliary anode, and the sealing material used in this embodiment, the materials used in Embodiment 1 may also be used. In addition, as a film formation method, an inkjet method, a mask deposition method, a printing method, or the like may also be used.

In a structure similar to that in this embodiment, an arrangement can be formed in which an opaque layer formed of Pt, Ir, Ni, Pd, Au, a laminate of ITO and Al, or the like is formed as a layer located at the position of the cathode 2; and a layer having a predetermined thickness formed of gold, calcium, aluminum, a laminate thereof, a layer formed by co-deposition of Mg and silver, or the like is formed as a transparent layer at the position of the anode 5. In this arrangement, by driving the layer located at the position of the cathode 2 and the layer located at the position of the anode 5 as an anode and a cathode, respectively, the light can be emitted from the light-emitting layer toward the upper layer via the protective substrate. In the case described above, the auxiliary anode 7 is used as an auxiliary layer for the cathode.

Embodiment 4

In this embodiment, an example will be described in which a plurality of cathodes 2 corresponding to a plurality of light-emitting pixels are formed on the substrate, pixel partitions formed of an insulating material are formed between the light-emitting pixels, and in each pixel, at least a cathode, a light-emitting layer, a transparent anode, and an auxiliary anode 7 are formed in this order.

Figure 4:
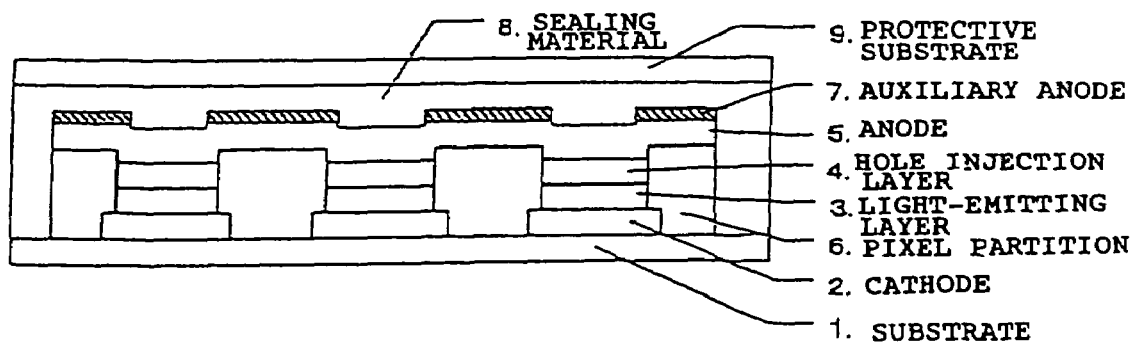
FIG. 4 is a cross-sectional view showing the structure of an organic EL device according to Embodiment 4.

In FIG. 4, a cross-sectional structure of an organic EL device of this embodiment is shown.

After cathodes 2 were patterned, pixel partitions 6 were formed of a polyimide and were patterned. Next, a film formed of calcium fluoride 20 Å thick was formed over the entire surface, films of three types of low molecular materials emitting red, green, and blue light were formed in red, green, and blue pixels, respectively, by patterning using a mask deposition method. Next, as a hole injection layer 4, TPD and MTDATA were sequentially deposited over the entire surface. Next, as anodes 5, IDIXO manufactured by Idemitsu Kosan Co., Ltd. was sputtered. Subsequently, tantalum 1,000 Å thick was formed by mask deposition and was then patterned. In addition, sealing was performed by an epoxy sealing material 8 and a protective substrate 9. To the individual pixels of the organic EL device thus formed, when voltages for red, blue, and green were independently applied, a uniform color image can be observed in accordance with the applied voltages.

As a reference example, when an element that was not provided with an auxiliary anode 7 was formed, only pixels in the vicinity of lead wires for the anodes emit light.

For the cathode, the light-emitting material, the hole injection material, the anode, the auxiliary anode, and the sealing material used in this embodiment, the materials used in Embodiment 1 may also be used. In addition, as a film formation method, an inkjet method, a printing method, or the like may also be used besides a mask deposition method.

In addition, as is the case described in Embodiment 3, when a layer at the position of the cathode 2 and a layer at the position of the anode 5 are formed of particular materials having particular thicknesses or the like, respectively, the layer at the position of the cathode 2 and the layer at the position of the anode 5 can also be driven as an anode and a cathode, respectively, so that the light is emitted from the light-emitting layer toward the outside via the protective substrate.

Embodiment 5

In this embodiment, an example will be described in which the auxiliary anode described above is formed of a light-absorbing conductive material.

Chromium was used instead of tantalum used for the auxiliary anode 7 in Embodiment 3. As a result, since the reflectance of chromium was 60%, the reflectance of outside light was decreased, and hence, enhancement in contrast could be observed.

As the light-absorbing conductive material, in addition to the chromium described above, a polymeric conductive material, such as Bytron manufactured by Bayer AG., or polyaniline, or carbon may also be used.

Embodiment 6

In this embodiment, an example will be described in which the auxiliary anode described above is formed of a light-absorbing conductive material, and in particular, the auxiliary anode is formed of carbon.

Carbon was used instead of tantalum used for the auxiliary anode 7 in Embodiment 4. The film formation thereof was performed by a mask deposition method. As a result, the reflectance of outside light was decreased to nearly zero, and the contrast could be significantly increased.

As the light-absorbing conductive material, in addition to carbon, a polymeric conductive material, such as Bytron manufactured by Bayer AG., or polyaniline, or chromium may also be used.

Embodiment 7

Figure 5:
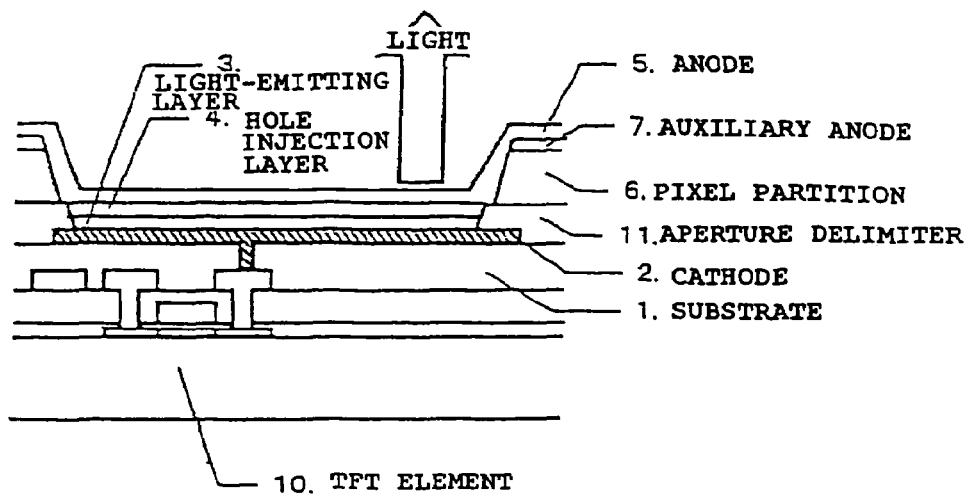
FIG. 5 is a cross-sectional view showing the structure of an organic EL device according to Embodiment 7.

In this embodiment, an example will be described in which an active matrix structure having switching elements is laminated on a substrate, and a pixel laminate structure formed of a cathode, a light-emitting layer, and an anode, is formed so as to overlap at least a part of the active matrix structure, in particular, at least a part of the switching element when viewed from the top side. In FIG. 5, a cross-sectional structure of an organic EL device of this embodiment is shown.

The structure in the figure is formed of the structure shown in FIG. 3 as a base material and a thin-film transistor (hereinafter referred to as "TFT") provided on the substrate as a switching element.

An aperture delimiter 11 is provided in a layer under a pixel partition, which defines a light-emitting area for the light from the light-emitting layer. In addition, as another example, a cross-sectional structure of an organic EL device is shown in FIG. 6 in which an anode, a cathode, and an anode are sequentially formed on a substrate in this order, and an area at which a TFT element 10 as a switching element is disposed is located under a pixel partition so as to substantially overlap the partition when viewed from the top side.

Figure 3:
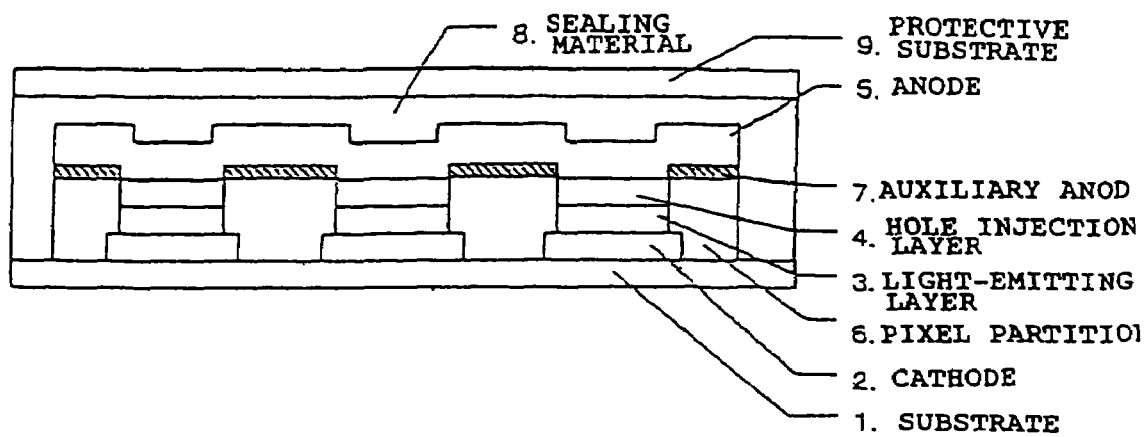
FIG. 3 is a cross-sectional view showing the structure of an organic EL device according to Embodiment 3.

As shown in FIG. 5, above the substrate provided with the TFT element 10, a light-emitting pixel structure (a laminate structure formed of a cathode 2, a light-emitting layer 3, and an anode 5) having an arrangement (additionally provided with an aperture delimiter 11) similar to that shown in FIG. 3 was formed. Similarly to the above, an organic EL device having a light-emitting pixel structure, which is shown in FIG. 6, was formed.

Figure 6:
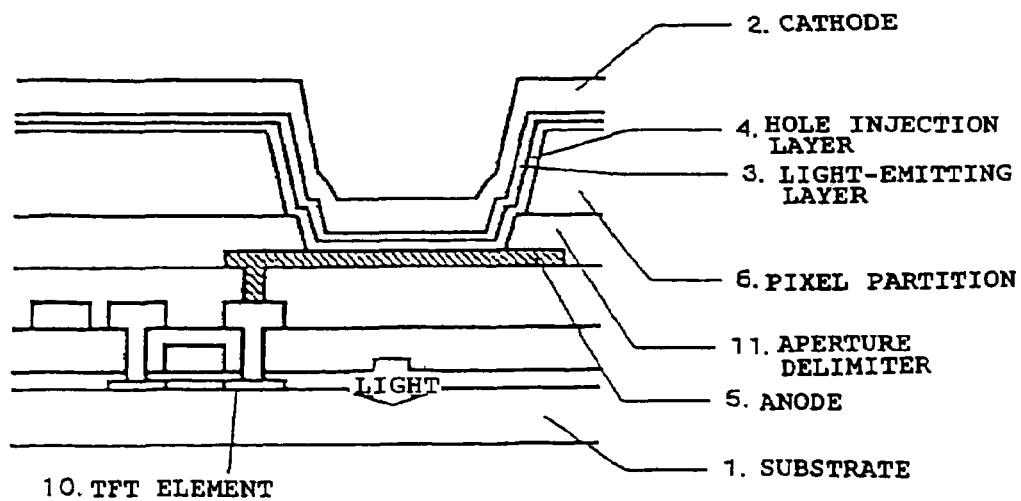
FIG. 6 is a cross-sectional view showing the structure of an organic EL device relating to Embodiment 7.

The organic EL device having the structure shown in FIG. 5 was driven so that the light was emitted to the anode 5 side, and the organic EL device having the structure shown in FIG. 6 was driven so that the light was emitted to the substrate 1 side. Compared to the structure (the aperture ratio was 30%) shown in FIG. 6, in the structure shown in FIG. 5, by virtue of the pixel structure provided at a side (substrate side) opposite to the side which the light is emitted to, in particular, by virtue of the switching element provided so as to overlap the light-emitting layer when viewed from the top side, the aperture ratio, which could make the light-emitting layer work, could be enhanced (the aperture ratio was 70%). Conventionally, in order to obtain a display luminance of 100 Cd/m2, a driving voltage of 6 volts is required; however, in this embodiment, 5 volts becomes enough to obtain a display luminance of 100 Cd/m2. Accordingly, the life is increased to 10 times that of the conventional structure.

According to this embodiment, an area of the pixel aperture can be designed independently from the switching element, such as a TFT circuit, and hence, the aperture ratio can be significantly improved.

In the structure shown in FIG. 5, as is the case described in Embodiment 3, when a layer at the position of the cathode 2 and a layer at the position of the anode 5 are formed of particular materials having particular thicknesses or the like, respectively, the layer at the position of the cathode 2 and the layer at the position of the anode 5 can also be driven as an anode and a cathode, respectively, so that the light is emitted from the light-emitting layer toward the outside via the protective substrate.

In addition, in the structure shown in FIG. 6, as is the case described in Embodiment 3, when a layer at the position of the cathode 2 and a layer at the position of the anode 5 are formed of particular materials having particular thicknesses or the like, respectively, the layer at the position of the cathode 2 and the layer at the position of the anode 5 can also be driven as an anode and a cathode, respectively, so that the light is emitted from the light-emitting layer toward the outside via the protective substrate. In the case described above, the aperture ratio can be enhanced similar to the structure shown in FIG. 5.

Embodiment 8

In embodiment, a semiconductor substrate having an integrated circuit formed thereon is used as a substrate to be used.

Figure 7:
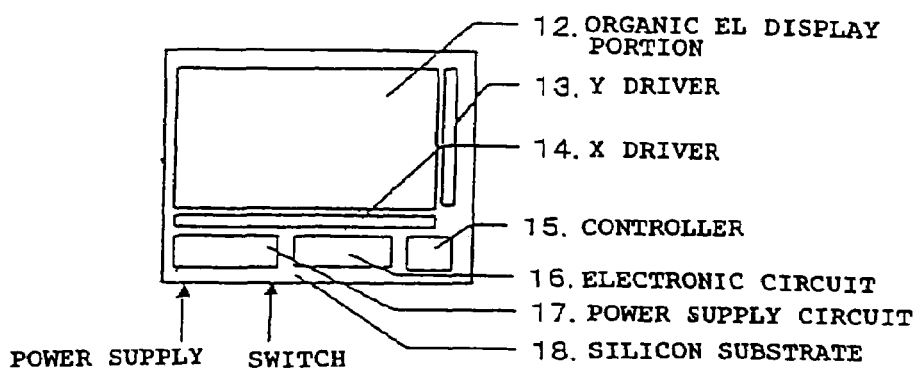
FIG. 7 is a schematic view showing a plan structure of an organic EL device (display device) according to Embodiment 8.

In this embodiment, an example will be described in which an electronic circuit for a mobile phone, a controller and a driver for display driving, and also a transistor for driving an organic EL device are formed on a silicon substrate, and the organic EL device is formed at a display portion. In FIG. 7, a schematic view of the silicon substrate provided with the organic EL device of this embodiment formed thereon is shown.

As shown in the figure, an organic EL device display portion 12 is provided on a silicon substrate 18 in which organic EL elements (a pixel structure) as shown in the embodiment described above are disposed in an XY matrix, an X driver 14 and a Y driver 13 for use in a matrix driving of the display portion are provided in the vicinity thereof, and in addition, a controller 15, an electronic circuit 16, and a power supply circuit 17 are provided and are connected to the power supply and switches. According to the arrangement described above, operations, such as those of a mobile phone, can be realized by forming every circuit on a one piece silicon substrate and by using switches to control from the exterior of the structure.

In this embodiment, the mobile phone is described by way of example, and in addition, this embodiment can also be used for applications which require power saving, and reduction in weight.

Embodiment 9

Figure 8:
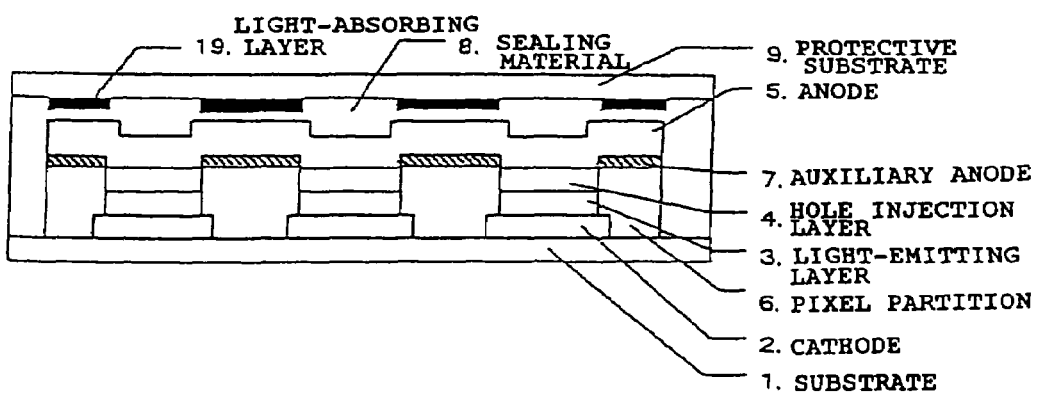
FIG. 8 is a cross-sectional view showing the structure of an organic EL device according to Embodiment 9.

In this embodiment, an example will be described in which after the anode or the auxiliary anode is formed, a protective substrate having a light-absorbing layer formed at a position corresponding to each position between the pixels is bonded to the pixels with a sealing material provided therebetween while the pixels on the substrate and areas of the protective substrate corresponding to pixels are aligned with each other. In FIG. 8, a cross-sectional structure of an organic EL device of this embodiment is shown.

A sealing material 8 is coated on the substrate provided with the anode described in Embodiment 3, and a light-absorbing layer 19 is formed so as to correspond to areas between the pixels. A protective substrate 9 is bonded thereto for fixing while being aligned. The organic EL device thus formed performs sufficiently uniform display by virtue of the effect of the auxiliary anode and can efficiently damp the reflection of outside light, whereby display can be performed having a superior contrast.

Embodiment 10

In this embodiment, an example will be described in which after the light-emitting layer is formed, a treatment for imparting hydrophilic properties is performed to the surface of the light-emitting layer in a method for manufacturing an organic EL device having at least a cathode, a light-emitting layer, a hole transport layer and/or a hole injection layer, and a transparent anode formed on a substrate in this order, and more particularly, in a method for manufacturing an element having the structure shown in FIG. 1.

In FIG. 1, when a polyfluorene material is used for a light-emitting layer 3, film formation of Bytron manufactured by Bayer AG., which is commonly used for a hole injection layer 4, may not be sufficiently performed in some cases due to the poor wettability thereof. Accordingly, after the light-emitting layer 3 was formed, when Bytron was spin-coated while oxygen plasma irradiation is performed, a uniform film could be obtained. The organic EL device thus formed emits light uniformly over the entire surface.

In this embodiment, as a method for imparting hydrophilic properties to the surface of the light-emitting layer, a UV ozone treatment may also be used.

As the material for the hole injection layer in this embodiment, a solution having a high polarity, such as a solution containing a polyaniline salt, may be used.

Embodiment 11

Figure 9:
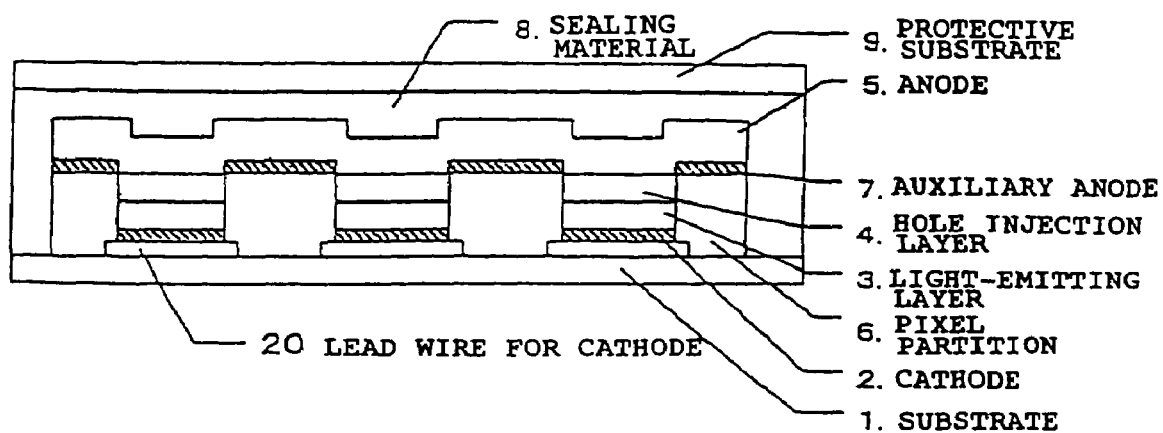
FIG. 9 is a cross-sectional view showing the structure of an organic EL device according to Embodiment 11.

In this embodiment, an example will be described in which at least insulating pixel partitions are formed on a substrate, a film for a reflective cathode is then formed over the entire surface and simultaneously cathodes and auxiliary anodes on the partition are separated from each other by steps thereof, and subsequently at least a light-emitting layer and a transparent anode are formed in the pixel in this order. In FIG. 9, a cross-sectional structure of an organic EL device of this embodiment is shown.

After a lead wire 20 for the cathode was patterned, and a pixel partition 6 was formed, aluminum was deposited as a cathode 2. In the step described above, a cathode pattern was formed by the wall of the pixel partition 6, and a pattern of an auxiliary anode 7 was simultaneously formed.

When an angle of the wall of the pixel partition 6 is determined so as to incline toward the exterior of the structure, patterning can be reliably performed; however, since wire breakage may occur until an anode 5 is subsequently formed, optimization is required.

Embodiment 12

In this embodiment, an example will be described in which, after cathodes are formed on a substrate, and an insulating material for pixel partitions is then coated on the entire surface and is calcined, a film formed of a material for an auxiliary anode is formed over the entire surface, the auxiliary anode layer is first etched for patterning in a photolithographic step, the pixel partition layer thereunder is then etched for patterning, the pixel partition layer is fired, and subsequently, at least a light-emitting layer and a transparent anode are formed in the pixel in this order. In particular, an element having the structure shown in FIG. 3 is formed.

First, a cathode 2 having a pattern was formed on a substrate 1. Next, a polyimide solution as a material for an insulating pixel partition 6 was coated over the entire surface of the substrate and was then calcined. Subsequently, tantalum having a film thickness of 1000 Å, which was to be used as an auxiliary anode 7, was formed by sputtering. Next, a resist was coated thereon and was then exposed. After development, the tantalum was etched. Subsequently, the polyimide was etched. Next, the resist was stripped away, and the polyimide was fired, whereby a structure having the pixel partitions 6 and the auxiliary anodes 7 was completed.

As the material for the pixel partition or the material for the auxiliary electrode, a material which can be patterned by a photographic step may also be used.

As has thus been described in detail, according to the present invention, when the structure is formed in which the cathode, the light-emitting layer, and the anode are formed in this order on the substrate of the organic EL device, an element arrangement can be provided in which the aperture ratio and the light transmittance are not decreased even when active elements are used, and in addition, a manufacturing method therefor can be provided. Accordingly, an organic EL device can be provided which consumes low electric power and also has a long life. In addition, at the same time, an organic EL device can be realized having a structure which prevents a decrease in contrast due to incident outside light without decreasing the luminance.

The invention claimed is:

1. An organic EL device comprising:
   a substrate;
   a plurality of pixels,
   a plurality of first electrodes corresponding to the plurality of pixels being formed on the substrate,
   a light-emitting layer formed over the first electrodes;
   a pixel partition including an insulating material being formed between the pixels,
   an auxiliary electrode including a conductive material and having a pattern equivalent to that of the partition being formed at a position corresponding to a top surface of the partition that includes the insulating material; and
   a second electrode continuous over the light-emitting layer and the auxiliary electrode.

2. The organic EL device according to claim 1, the pixel partition including a first layer and second layer.

3. The organic EL device according to claim 2, the first layer protruding from the second layer and delineating the light-emitting layer.

4. An organic EL device comprising:
   a substrate;
   a plurality of pixels,
   a plurality of first electrodes corresponding to the plurality of pixels being formed on the substrate,
   a pixel partition including an insulating material being formed between the pixels,
   a light-emitting layer formed over the first electrodes;
   a second electrode continuous over the light-emitting layer and the pixel partition;
   a auxiliary electrode including a conductive material being formed over the second electrode at a position corresponding to the pixel partition.

5. The organic EL device according to claim 4, the substrate being a semiconductor substrate having an integrated circuit formed thereon.

6. The organ EL device according to claim 5, the integrated circuit including at least one of a controller, a power supply circuit, an X driver and a Y driver.

7. The organic EL device according to claim 4, wherein, after at least one of the second electrode and the auxiliary electrode are formed, a protective substrate having a light-absorbing layer formed at a position corresponding to a position between the pixels is disposed so that the pixel and an area of the protective substrate corresponding to the pixel are aligned with each other, and the protective substrate is subsequently bonded thereto with a sealing resin provided therebetween.

8. The organic EL device according to claim 4, the pixel partition including a first layer and a second layer.

9. The organic EL device according to claim 8, the first layer protruding from the second layer and delineating the light-emitting layer.

10. The organic EL device according to claim 4, the auxiliary electrode including a light-absorbing conductive material.

11. The organic EL device according to claim 10, the auxiliary electrode including carbon or chromium.

* * * * *